US 7,640,806 B2

(12) United States Patent
Umemura et al.

(10) Patent No.: US 7,640,806 B2
(45) Date of Patent: Jan. 5, 2010

(54) CAPACITIVE PHYSICAL QUANTITY SENSOR

(75) Inventors: Akinobu Umemura, Nagoya (JP); Junji Hayakawa, Okazaki (JP)

(73) Assignee: DENSO CORPORATION, Kariya (JP)

( * ) Notice: Subject to any disclaimer, the term of this patent is extended or adjusted under 35 U.S.C. 154(b) by 547 days.

(21) Appl. No.: 11/642,714

(22) Filed: Dec. 21, 2006

(65) Prior Publication Data
US 2007/0159183 A1 Jul. 12, 2007

(30) Foreign Application Priority Data
Jan. 12, 2006 (JP) ............... 2006-004790

(51) Int. Cl.
G01P 15/125 (2006.01)
(52) U.S. Cl. .................... 73/514.32; 324/679
(58) Field of Classification Search .......... 73/514.32, 73/38.1, 714, 514.19; 324/661, 679, 606; 361/281; 280/735
See application file for complete search history.

(56) References Cited

U.S. PATENT DOCUMENTS

| 4,295,090 | A | 10/1981 | Ponkala |
| 4,347,741 | A * | 9/1982 | Geiger ...................... 73/304 C |
| 5,633,594 | A | 5/1997 | Okada |
| 6,257,061 | B1 | 7/2001 | Nonoyama et al. |
| 6,483,322 | B2 | 11/2002 | Aoyama et al. |
| 7,109,727 | B2 * | 9/2006 | Hayakawa et al. .......... 324/679 |
| 7,180,798 | B2 * | 2/2007 | Nishikawa et al. .......... 365/191 |
| 2002/0011108 | A1 * | 1/2002 | Aoyama et al. .......... 73/514.32 |
| 2002/0053916 | A1 * | 5/2002 | Tanizawa ..................... 324/713 |
| 2002/0097034 | A1 * | 7/2002 | Tanizawa ..................... 323/367 |
| 2005/0194651 | A1 * | 9/2005 | Ohashi ........................ 257/415 |
| 2006/0037393 | A1 * | 2/2006 | Itakura et al. ............. 73/335.04 |
| 2006/0061372 | A1 * | 3/2006 | Hayakawa et al. .......... 324/679 |
| 2006/0065053 | A1 * | 3/2006 | Goto ........................ 73/514.32 |
| 2007/0222193 | A1 * | 9/2007 | Ito ............................. 280/735 |
| 2007/0236231 | A1 * | 10/2007 | Hattori ....................... 324/679 |
| 2008/0284396 | A1 * | 11/2008 | Hata et al. .................. 323/282 |

FOREIGN PATENT DOCUMENTS

GB    2 006 442    5/1979

OTHER PUBLICATIONS

Office Action dated Jul. 3, 2008 in corresponding DE application No. 10 2007 001 105.0.

* cited by examiner

Primary Examiner—Hezron Williams
Assistant Examiner—Samir M Shah
(74) Attorney, Agent, or Firm—Posz Law Group, PLC

(57) ABSTRACT

A capacitive physical quantity sensor includes a sensor element and a detecting element. The sensor element includes first and second fixed electrodes facing a movable electrode. A first voltage is applied to the first fixed electrode and a second voltage is applied to the second fixed electrode. The detecting circuit includes a capacitance-voltage conversion circuit, in which an operational amplifier, a capacitor and a switch including a P-channel MOS transistor and a N-channel MOS transistor are disposed. The transistors have a back gate potential, which is approximately equal to an average voltage of the first voltage and the second voltage.

6 Claims, 3 Drawing Sheets

US 7,640,806 B2

CAPACITIVE PHYSICAL QUANTITY SENSOR

CROSS REFERENCE TO RELATED APPLICATION

This application is based on Japanese Patent Application No. 2006-4790 filed on Jan. 12, 2006, the disclosure of which is incorporated herein by reference.

FIELD OF THE INVENTION

The present invention relates to a capacitive physical quantity sensor.

BACKGROUND OF THE INVENTION

U.S. Pat. No. 6,483,322 (corresponding to JP-A-2000-40047) discloses a capacitive acceleration sensor used in an automotive vehicle. In a sensor element of the sensor, a capacitive variation is generated by an acceleration variation. The capacitive variation is converted into an electrical signal by a capacitance-voltage (C-V) conversion circuit. The converted signal is differentially amplified by a signal processing circuit including a sampling and holding circuit and a switched capacitor circuit. Thus, the sensor can output an output signal corresponding to the acceleration variation.

In order to output a sensitive output signal, a high-power C-V conversion circuit and a high-gain amplifying circuit are required in the capacitive acceleration sensor. Therefore, the C-V conversion circuit includes a switched capacitor system, and performs a high-power C-V conversion.

In the C-V conversion circuit including the switched capacitor system, an analog switch has a circuitry shown in FIG. 5. That is, the analog switch includes a P-channel metal-oxide semiconductor (Pch-MOS) transistor 101 and a N-channel metal-oxide semiconductor (Nch-MOS) transistor 102. The Pch-MOS transistor 101 has a back gate potential VG of Vdd, and the Nch-MOS transistor 102 has a ground potential GND as its back gate potential VG. Then, a potential difference is generated between an input potential from a sensor element and the back gate potential VG of the transistor 101, 102. Therefore, electricity leak may be generated in a semiconductor substrate, on which the transistors 101, 102 are formed. Especially, the electricity leak may be large in a high-temperature range. Thus, a temperature characteristic of a zero-point offset or sensitivity may be lowered, especially in the high-temperature range.

SUMMARY OF THE INVENTION

In view of the foregoing and other problems, it is an object of the present disclosure to provide a capacitive physical quantity sensor.

According to a first aspect of the disclosure, a capacitive physical quantity sensor includes a sensor element and a detecting circuit. The sensor element includes a movable electrode displaceable in accordance with a variation of a physical quantity, and first and second fixed electrodes facing the movable electrode. The first periodic carrier wave voltage is applied to the first fixed electrode and a second periodic carrier wave voltage is applied to the second fixed electrode. The first and second voltages are inverse to each other. The detecting circuit includes a capacitance-voltage conversion circuit, into which an input potential corresponding to a variation of a capacitance between the movable electrode and the first and second fixed electrodes is input, and from which a voltage signal corresponding to the variation of the capacitance is output. The capacitance-voltage conversion circuit includes an operational amplifier, a capacitor and a switch. A signal corresponding to the variation of the capacitance is input into an inverting input terminal of the operational amplifier. The capacitor is connected between the inverting input terminal and an output terminal of the operational amplifier. The switch is connected in parallel to the capacitor, and includes a P-channel MOS transistor and a N-channel MOS transistor, which are connected in parallel to the capacitor. The P-channel MOS transistor and the N-channel MOS transistor have a back gate potential, which is approximately equal to an average voltage of the first periodic carrier wave voltage and the second periodic carrier wave voltage.

According to a second aspect of the disclosure, a capacitive physical quantity sensor includes a sensor element and a detecting circuit. The sensor element includes a movable electrode displaceable in accordance with a variation of a physical quantity, and first and second fixed electrodes facing the movable electrode. A first periodic carrier wave voltage is applied to the first fixed electrode and a second periodic carrier wave voltage is applied to the second fixed electrode. The first and second voltages are inverse to each other. The detecting circuit includes a capacitance-voltage conversion circuit, into which an input potential corresponding to a variation of a capacitance between the movable electrode and the first and second fixed electrodes is input, and from which a voltage signal corresponding to the variation of the capacitance is output. The detecting circuit further includes a sample-hold circuit for sampling and holding the voltage signal. The sample-hold circuit includes a switch for switching the sampling and the holding. The switch includes a P-channel MOS transistor and a N-channel MOS transistor, which are connected in parallel to each other. The P-channel MOS transistor and the N-channel MOS transistor have a back gate potential, which is approximately equal to an average voltage of the first periodic carrier wave voltage and the second periodic carrier wave voltage.

According to a third aspect of the disclosure, a capacitive physical quantity sensor includes a sensor element and a detecting circuit. The sensor element includes a movable electrode displaceable in accordance with a variation of a physical quantity, and first and second fixed electrodes facing the movable electrode. The first periodic carrier wave voltage is applied to the first fixed electrode and a second periodic carrier wave voltage is applied to the second fixed electrode. The first and second voltages are inverse to each other. The detecting circuit includes a capacitance-voltage conversion circuit, into which an input potential corresponding to a variation of a capacitance between the movable electrode and the first and second fixed electrodes is input, and from which a voltage signal corresponding to the variation of the capacitance is output. The detecting circuit further includes a LPF circuit for filtering a frequency band in a predetermined range from the voltage signal of the capacitance-voltage conversion circuit. The LPF circuit includes a switch, in which a P-channel MOS transistor and a N-channel MOS transistor are connected in parallel to each other. The P-channel MOS transistor and the N-channel MOS transistor have a back gate potential, which is approximately equal to an average voltage of the first periodic carrier wave voltage and the second periodic carrier wave voltage.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF PREFERRED EMBODIMENTS

First Embodiment

Figure 1:
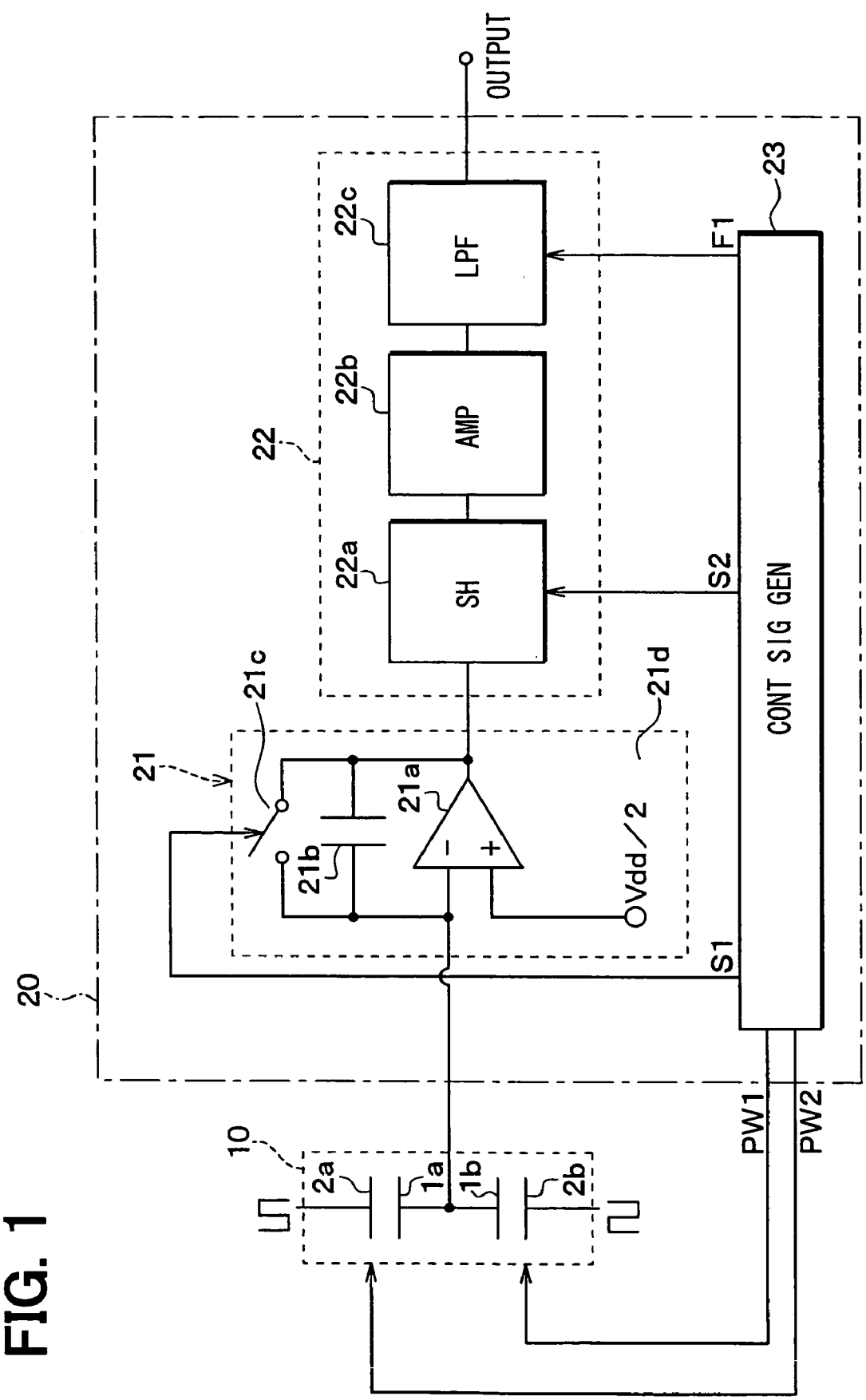
FIG. 1 is a block diagram showing a capacitive physical quantity sensor according to a first embodiment.

As shown in FIG. 1, a capacitive acceleration sensor according to a first embodiment includes a sensor element 10 and a detecting circuit 20. The sensor element 10 includes movable electrodes 1a, 1b and fixed electrodes 2a, 2b. The detecting circuit 20 detects an acceleration based on a variation of a differential capacitance between the movable electrode 1a, 1b and the fixed electrode 2a, 2b.

The sensor element 10 includes a beam structure, and the movable electrode 1a, 1b and the fixed electrode 2a, 2b are constructed with the beam structure. The differential capacitance is formed by the movable electrode 1a, 1b and the fixed electrode 2a, 2b, which are positioned to face each other. Each of signals (carrier wave) PW1, PW2 is periodically applied to each of the fixed electrodes 2a, 2b, and the signals applied to the fixed electrodes 2a, 2b are inverse to each other. Thereby, an acceleration is detected based on a variation of the differential capacitance, and the variation corresponds to a displacement of the movable electrodes 1a, 1b.

The detecting circuit 20 includes a capacitance-voltage (C-V) conversion circuit 21, a differential amplification circuit 22 and a control signal generating circuit 23. The C-V conversion circuit 21 converts the variation of the differential capacitance into a voltage, and includes an operational amplifier 21a, a capacitor 21b, a switch 21c and a center voltage supplying circuit 21d. An inverting input terminal of the amplifier 21a is connected to the movable electrodes 1a, 1b, and the capacitor 21b and the switch 21c are connected in parallel to the amplifier 21a between the inverting input terminal and an output terminal. The switch 21c is driven by a signal S1 from the control signal generating circuit 24. A voltage supplied from the center voltage supplying circuit 21d is input into a non-inverting input terminal of the amplifier 21a. Specifically, a half voltage, i.e., center (average) voltage, Vdd/2 (2.5V) of a voltage Vdd (5V) applied to the fixed electrode 2a, 2b is applied to the non-inverting input terminal of the amplifier 21a from the center voltage supplying circuit 21d.

Figure 2:
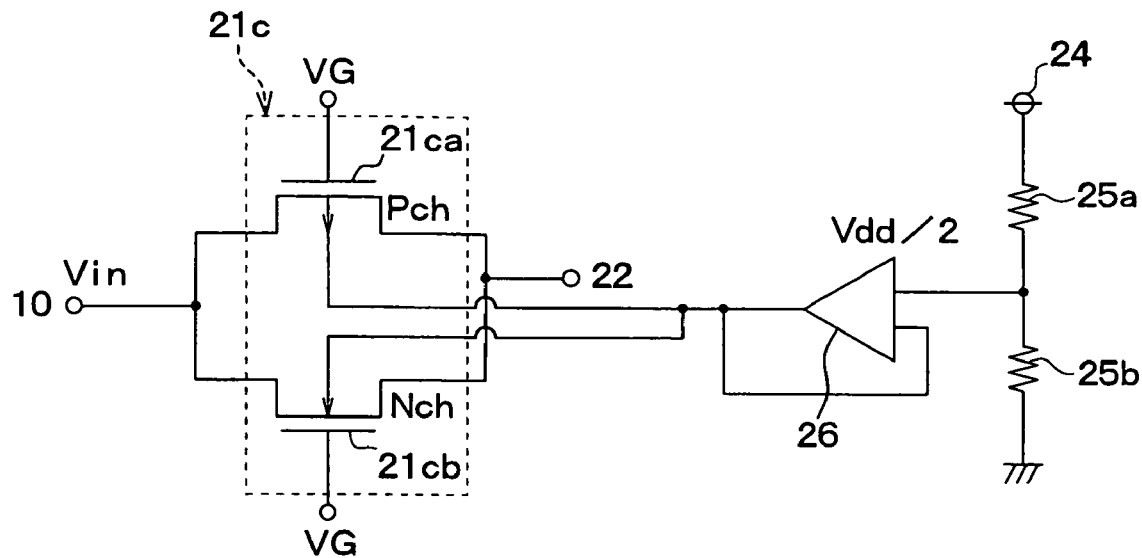
FIG. 2 is a circuit diagram showing a switch in a C-V conversion circuit shown in FIG. 1.

As shown in FIG. 2, the switch 21c includes a P-channel metal-oxide semiconductor (Pch-MOS) transistor 21ca and a N-channel metal-oxide semiconductor (Nch-MOS) transistor 21cb. The Pch-MOS transistor 21ca and the Nch-MOS transistor 21cb are connected in parallel to each other. That is, sources of the transistors 21ca, 21cb are connected to each other, and drains of the transistors 21ca, 21cb are connected to each other. A constant-voltage source 24 supplies a constant voltage Vdd. Voltage dividing resistors 25a, 25b divide the constant voltage Vdd into the center voltage Vdd/2, and the center voltage Vdd/2 is applied to back gate potentials VG of the transistors 21ca, 21cb through a voltage follower 26.

In addition, the signal S1 is applied to gates of the transistors 21ca, 21cb, and the transistors 21ca, 21cb are turned on/off in response to the signal S1. The differential amplification circuit 22 includes a sampling and holding (SH) circuit 22a, an amplifying (AMP) circuit 22b and a low-pass filter (LPF) circuit 22c. The SH circuit 22a is driven by a signal S2 from the control signal generating circuit 23. The SH circuit 22a samples an output from the C-V conversion circuit 21, and holds the output for a predetermined period. The amplifying circuit 22b amplifies the output with a predetermined gain. The LPF circuit 22c is driven by a signal F1 from the control signal generating circuit 23. The LPF circuit 22c selects a signal in a predetermined frequency band component from the outputs of the SH circuit 22a, and outputs the signal as an acceleration signal. The control signal generating circuit 23 outputs the signals PW1, PW2 with a predetermined period, the signal S1 instructing a timing for switching the switch 21c, the signal S2 for the SH circuit 22a and the signal F1 for the LPF circuit 22c.

Figure 3:
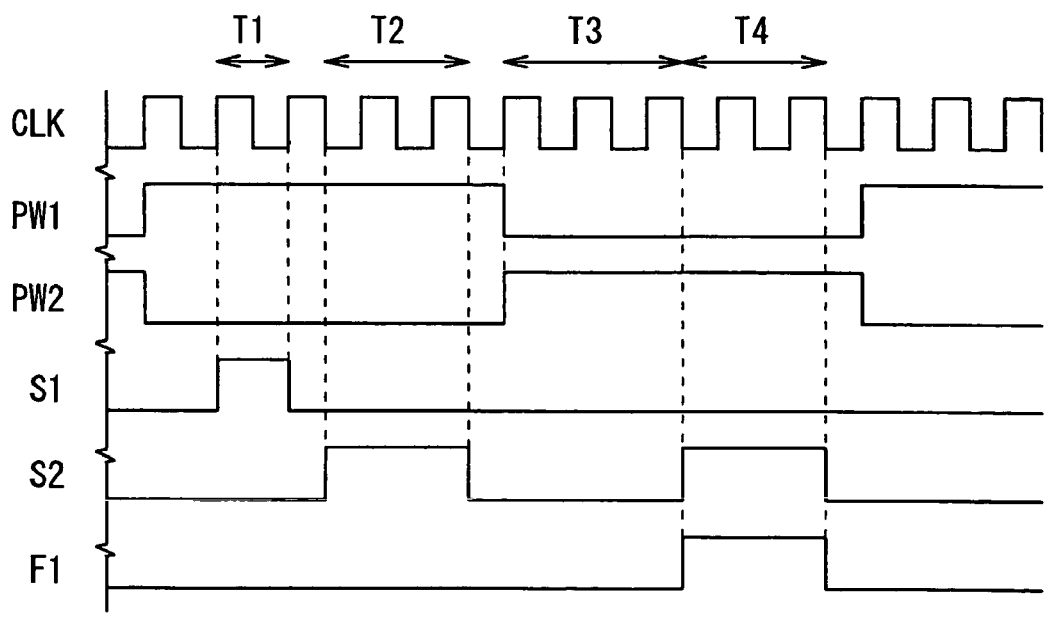
FIG. 3 is a timing chart for detecting an acceleration.

Next, an operation of the acceleration sensor will be described with reference to FIG. 3. Each of the signals PW1, PW2 from the circuit 23 has a predetermined amplitude of a voltage Vdd (5V), and levels of the voltages Vdd of the signals PW1, PW2 are inverse to each other. The signals PW1, PW2 have rectangular-wave shapes with the predetermined amplitude, and vary between a high level (Hi) and a low level (Lo) in four periods T1-T4 in each detection cycle.

In the first period T1, the signals PW1, PW2 set an electrical potential of the fixed electrode 2a to Vdd, and an electrical potential of the fixed electrode 2b to 0V. Further, the switch 21c is closed by the signal S1 from the circuit 23. Thus, the movable electrodes 1a, 1b have a bias voltage Vdd/2 by an operation of the amplifier 21a, and an electrical charge in the capacitor 21b is discharged, which will be a feedback capacitance.

If a capacitance C1 between the movable electrode 1a and the fixed electrode 2a is larger than a capacitance C2 between the movable electrode 1b and the fixed electrode 2b (i.e., C1>C2), the movable electrodes 1a, 1b hold a large amount of negative charges, because of this relation and the voltages applied to the fixed electrodes 2a, 2b.

In the second period T2, the signals PW1, PW2 set the electrical potential of the fixed electrode 2a to Vdd, and the electrical potential of the fixed electrode 2b to 0V. Further, the switch 21c is opened by the signal S1. Thereby, the capacitor 21b is charged with electricity corresponding to a state of the movable electrodes 1a, 1b. Then, the C-V conversion circuit 21 outputs a voltage signal corresponding to the charge in the capacitor 21b, and the SH circuit 23a samples and holds the voltage signal in response to the signal S2.

In the third period T3, the signals PW1, PW2 set the electrical potential of the fixed electrode 2a to 0V, and the electrical potential of the fixed electrode 2b to Vdd. That is, the electrical potentials are interchanged. Further, the switch 21c is kept to be open by the signal S1. At this time, a state of the electrical charge in the movable electrodes 1a, 1b is inverse to that in the second period T2 due to an inversion of the signals PW1, PW2. That is, when the capacitance C1 is larger than the capacitance C2 (C1>C2), the movable electrodes 1a, 1b hold a large amount of positive charges due to an inversion of the voltages applied to the fixed electrodes 2a, 2b.

However, at this time, because a circuit between the movable electrode 1a, 1b and the capacitor 21b is closed, the electrical charges discharged in the first period T1 are stored in the circuit. Therefore, a part of the electrical charges is transferred and stored in the capacitor 21b for balance. Then, the C-V conversion circuit 21 outputs a voltage signal, which is proportional to the transferred charge, and inversely proportional to a capacitance C of the capacitor 21b, based on a relation of Q=CV.

In the fourth period T4, the signals PW1, PW2 set the electrical potential of the fixed electrode 2a to 0V, and the electrical potential of the fixed electrode 2b to Vdd. After the voltage signal from the C-V conversion circuit 21 becomes sufficiently stable, the SH circuit 22a samples and holds the voltage signal from the C-V conversion circuit 21 in response to the signal S2.

The SH circuit 22a performs a differential calculation between the voltage signal sampled in the second period T2 and the voltage signal sampled in the fourth period T4, and outputs the calculated result. Based on the result, an acceleration corresponding to a displacement of the movable electrodes 1a, 1b can be detected.

The movable electrodes 1a, 1b have a bias potential Vdd/2, as described above. At this time, the Pch-MOS transistor 21ca and the Nch-MOS transistor 21cb have the back gate potential VG of Vdd/2. Therefore, a difference between the movable electrode 1a, 1b potential corresponding to an input voltage Vin and the back gate potential VG can be eliminated. Accordingly, electricity is restricted from leaking in a semiconductor substrate, on which the transistors 21ca, 21cb are formed, and temperature characteristic of a zero-point offset or sensitivity can be maintained.

Second Embodiment

In a second embodiment, a SH circuit 22a includes a switched capacitor system, and a difference between a movable electrode 1a, 1b potential corresponding to an input voltage Vin and a back gate potential VG is reduced in the SH circuit 22a, similarly to the first embodiment.

Figure 4A:
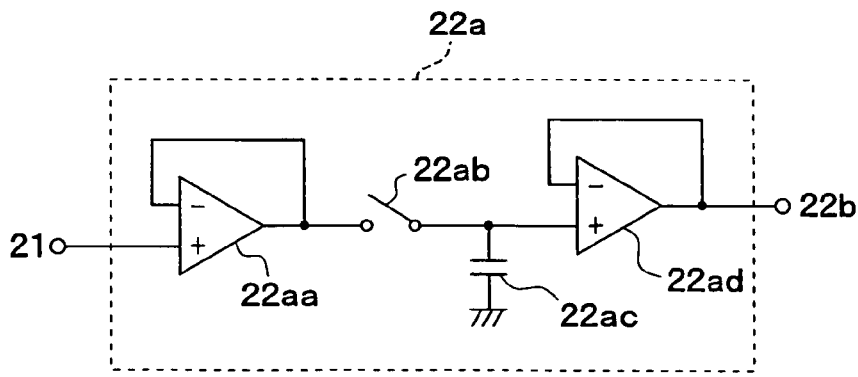
FIG. 4A is a circuit diagram showing a sampling and holding circuit in a capacitive physical quantity sensor according to a second embodiment.

As shown in FIG. 4A, the SH circuit 22a includes a calculation amplifiers 22aa, 22ad, a switch 22ab and a capacitor 22ac. When the switch 22ab is turned on at a sampling time, the capacitor 22ac is charged with the input potential Vin from the C-V conversion circuit 21. When the switch 22ab is turned off, the input potential Vin is stored in the capacitor 22ac.

Figure 4B:
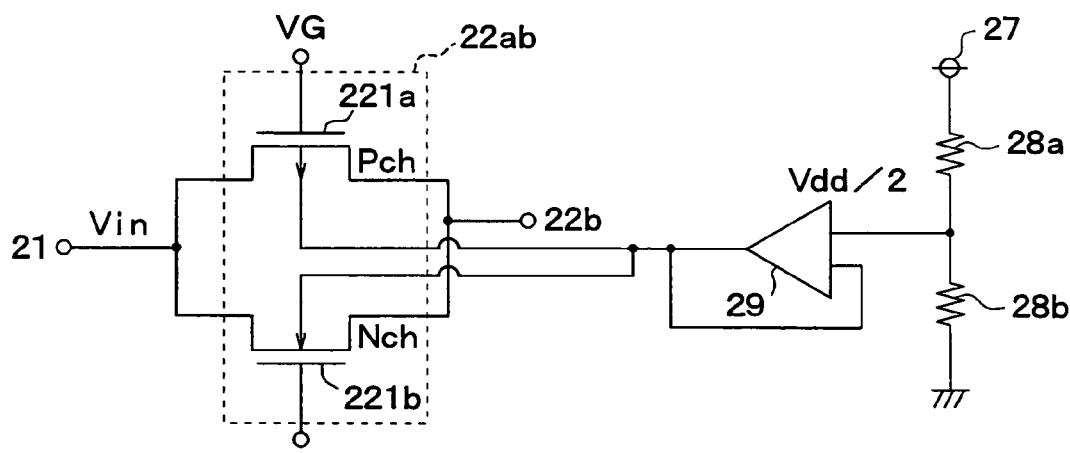
FIG. 4B is a circuit diagram showing a switch in the sampling and holding circuit.
Figure 5:
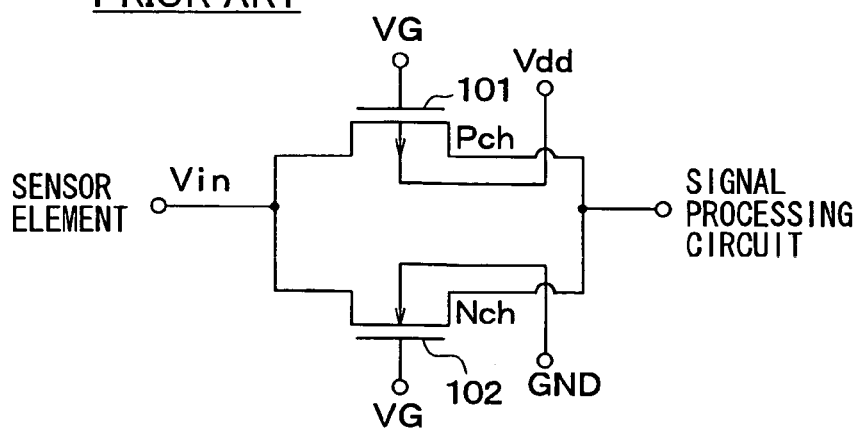
FIG. 5 is a circuit diagram showing a switch in a C-V conversion circuit of a conventional capacitive physical quantity sensor.

The switch 22ab of the SH circuit 22a has a structure, which is similar to the structure of the switch 21c of the C-V conversion circuit 21. That is, as shown in FIG. 4B, the switch 22ab includes a Pch-MOS transistor 221a and a Nch-MOS transistor 221b. The Pch-MOS transistor 221a and the Nch-MOS transistor 221b are connected in parallel to each other. That is, sources of the transistors 221a, 221b are connected to each other, and drains of the transistors 221a, 221b are connected to each other. The transistors 221a, 221b have a back gate potential VG of Vdd/2 due to a constant-voltage supply 27, resistors 28a, 28b and a voltage follower circuit 29.

Thus, a difference between a movable electrode 1a, 1b potential corresponding to the input potential Vin and the back gate potential VG can be eliminated in the SH circuit 22a. Accordingly, electricity is restricted from leaking in a semiconductor substrate, on which the transistors 221a, 221b are formed, and temperature characteristic of a zero-point offset or sensitivity can be maintained.

Other Embodiments

A LPF circuit 22c includes a switched capacitor system. That is, the LPF circuit 22c includes a switch having a Pch-MOS transistor and a Nch-MOS transistor. Therefore, when a difference between a movable electrode 1a, 1b potential corresponding to an input potential and a back gate potential is reduced in the LPF circuit 22c, the same advantages can be provided as the above embodiments.

In the above embodiments, the acceleration sensors are described as a capacitive physical quantity sensor. Alternatively, a pressure sensor or a yaw rate sensor may be used as the capacitive physical quantity sensor.

The first and second periodic carrier wave voltages PW1, PW2 may have rectangular-wave shapes, and may vary between 0V and a predetermined voltage. The second voltage PW2 may be set to the other level, when the first voltage PW1 is set to one of 0V and the predetermined voltage. The back gate potential may be constant to be the average voltage.

While the invention has been described with reference to a preferred embodiment thereof, it is to be understood that the invention is not limited to the preferred embodiment and constructions. The invention is intended to cover various modification and equivalent arrangements. The invention is intended to cover various combinations and configurations, which are preferred, other combinations and configurations, including more, less or only a single element, are also within the spirit and scope of the invention.

What is claimed is:

1. A capacitive physical quantity sensor comprising:
a sensor element including a movable electrode displaceable in accordance with a variation of a physical quantity, and first and second fixed electrodes facing the movable electrode, wherein a first periodic carrier wave voltage is applied to the first fixed electrode and a second periodic carrier wave voltage is applied to the second fixed electrode, the first and second periodic carrier wave voltages are inverse to each other; and
a detecting circuit including a capacitance-voltage conversion circuit, into which an input potential corresponding to a variation of a capacitance between the movable electrode and the first and second fixed electrodes is input, and from which a voltage signal corresponding to the variation of the capacitance is output, wherein
the detecting circuit further includes a sample-hold circuit for sampling and holding the voltage signal,
the sample-hold circuit includes a switch for switching the sampling and the holding,
the switch includes a P-channel MOS transistor and a N-channel MOS transistor, which are connected in parallel to each other, and
the P-channel MOS transistor and the N-channel MOS transistor have a back gate potential, which is approximately equal to an average voltage of the first periodic carrier wave voltage and the second periodic carrier wave voltage.

2. The capacitive physical quantity sensor according to claim 1, wherein:
the detecting circuit further includes a LPF circuit for filtering a frequency band in a predetermined range from the voltage signal of the capacitance-voltage conversion circuit,
the LPF circuit includes a switch,
the switch includes a P-channel MOS transistor and a N-channel MOS transistor, which are connected in parallel to each other, and
the P-channel MOS transistor and the N-channel MOS transistor have a back gate potential, which is approximately equal to the average voltage.

3. The capacitive physical quantity sensor according to claim 1, wherein:
the physical quantity is an acceleration.

4. The capacitive physical quantity sensor according to claim 1, wherein:
the first and second periodic carrier wave voltages have rectangular-wave shapes, and vary between 0V and a predetermined voltage.

5. The capacitive physical quantity sensor according to claim 4, wherein:
the second periodic carrier wave voltage is set to 0V, when the first periodic carrier wave voltage is set to the predetermined voltage; and
the second periodic carrier wave voltage is set to the predetermined voltage, when the first periodic carrier wave voltage is set to 0V.

6. The capacitive physical quantity sensor according to claim 1, wherein:
the back gate potential is constant to be the average voltage.

* * * * *